United States Patent
Chou et al.

(10) Patent No.: US 10,681,833 B1
(45) Date of Patent: Jun. 9, 2020

(54) MOUNTING ASSEMBLY AND INVERTER ASSEMBLY USING SAME

(71) Applicant: Delta Electronics, Inc., Taoyuan (TW)

(72) Inventors: Cheng-Wei Chou, Taoyuan (TW); Chen-Wei Ku, Taoyuan (TW); Xin-Hung Lin, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

(21) Appl. No.: 16/440,107

(22) Filed: Jun. 13, 2019

(30) Foreign Application Priority Data

Apr. 23, 2019 (CN) .......................... 2019 1 0328585

(51) Int. Cl.
| | |
|---|---|
| *G06F 1/18* | (2006.01) |
| *H05K 7/14* | (2006.01) |
| *H05K 5/06* | (2006.01) |
| *H02M 7/00* | (2006.01) |

(52) U.S. Cl.
CPC ........... *H05K 7/1427* (2013.01); *G06F 1/188* (2013.01); *H02M 7/003* (2013.01); *H05K 5/06* (2013.01)

(58) Field of Classification Search
None
See application file for complete search history.

(56) References Cited

U.S. PATENT DOCUMENTS

| | | | | |
|---|---|---|---|---|
| 7,551,439 | B2* | 6/2009 | Peugh | H01L 23/053 165/80.4 |
| 8,441,160 | B2* | 5/2013 | Watanabe | F04C 23/008 310/71 |
| 8,582,291 | B2* | 11/2013 | Nakasaka | H01L 23/4093 257/707 |
| 2013/0301220 | A1* | 11/2013 | Hotta | H05K 7/20218 361/699 |
| 2016/0242313 | A1* | 8/2016 | Singh | H05K 1/184 |
| 2016/0255750 | A1* | 9/2016 | Yoshida | H01R 13/6593 174/359 |
| 2017/0359926 | A1* | 12/2017 | Lu | H01R 12/52 |
| 2018/0351018 | A1* | 12/2018 | Choi | H01L 31/048 |
| 2019/0074794 | A1* | 3/2019 | Lee | H02S 40/34 |
| 2019/0386547 | A1* | 12/2019 | Im | H02K 9/22 |

* cited by examiner

*Primary Examiner* — Courtney L Smith
(74) *Attorney, Agent, or Firm* — Kirton McConkie; Evan R. Witt

(57) ABSTRACT

A mounting assembly and an inverter assembly using the same are disclosed. The mounting assembly includes a waterproof component and a fixing component. The waterproof component includes a first side facing the inverter, a second side facing the wall surface, an opening and a gasket set. The opening runs through the first side and the second side. The gasket set is disposed around the opening. The gasket set abuts against the wall surface and the inverter. The inverter is electrically connected with a wire running through the opening. The fixing component is disposed on the wall surface and connected to the waterproof component. The fixing component includes a third surface facing the inverter, a fourth surface facing the wall surface, and a first engaging element. The first engaging element engages with a second engaging element of the inverter to mount the inverter on the wall surface.

17 Claims, 10 Drawing Sheets

US 10,681,833 B1

MOUNTING ASSEMBLY AND INVERTER ASSEMBLY USING SAME

FIELD OF THE INVENTION

The present disclosure relates to a mounting assembly, and more particularly to a waterproof-designed mounting assembly and an inverter assembly using the same.

BACKGROUND OF THE INVENTION

An inverter is a power conversion device that converts electric power from direct current (DC) to alternating current (AC) or from AC to DC. The inverter is widely applied and is installed in various places according to the practical requirements. Generally, the inverter has an input or output wire exposed outside when the inverter is installed. If the inverter is installed outdoors, the exposed wire has to withstand the risk of direct exposure to the sun and the exposed wire is prone to aging. Moreover, the exposed wire makes the appearance of the overall installation structure not beautiful enough. If there are too many wires connected, it will be messier.

On the other hand, when the inverter is installed in the outdoor space, the casing body of the inverter needs to protect the inverter from being damaged by the rain. However, the mounting assembly of the conventional inverter is not waterproof, and do not provide sufficient protection and safety.

Therefore, there is a need for providing a waterproof-designed mounting assembly and an inverter assembly using the same to overcome the above drawbacks.

SUMMARY OF THE INVENTION

An object of the present disclosure is to provide a waterproof-designed mounting assembly and an inverter assembly using the same. By utilizing the waterproof-designed mounting assembly, the inverter can be directly mounted on, for example, a vertical wall, and electrically connected to the wires led out from the wall at the shortest distance. At the same time, the waterproof function is achieved. The structure of the mounting assembly is compact, and the conductive wires are kept from being exposed. Thus, the installation process of the inverter is simplified and the safety of the inverter assembly is ensured for use.

Another object of the present disclosure is to provide a waterproof-designed mounting assembly and an inverter assembly using the same. The mounting assembly has waterproof and fixing functions combined together. During installation, the mounting assembly allows the wire port of the inverter to be directly aligned with the wire outlet of the wall, so as to simplify the installation process. After installation, the mounting assembly keeps the conductive wires of the inverter from being exposed, and the inverter is electrically connected to the wires led out from the wire outlet on the wall surface at the shortest distance. Thus, the waterproofness of the inverter is effectively improved and the safety of the inverter assembly is ensured for use.

In accordance with an aspect of the present disclosure, a mounting assembly is disclosed. The mounting assembly is applied to an inverter and includes a waterproof component and a fixing component. The waterproof component is configured to be mounted on a wall surface and includes a first side, a second side, at least one opening and at least one gasket set. The first side and the second side are opposite to each other, the first side is adapted to face the inverter, and the second side is adapted to face the wall surface. The at least one opening runs through the first side and the second side and is adapted to spatially correspond to a wire outlet on the wall surface and a wire port of the inverter. The at least one gasket set is disposed around the periphery of the at least one opening. When the inverter is mounted on the wall surface, the at least one opening is aligned to the wire port, the at least one gasket set abuts against the wall surface and the inverter, respectively, and the inverter is in electrical connection with a wire running through the wire outlet, the at least one opening and the wire port. The fixing component is configured to be disposed on the wall surface and connected to the waterproof component. The fixing component includes a third side, a fourth side and at least one first engaging element. The third side and the fourth side are opposite to each other, the third side is adapted to face the inverter, and the fourth side is adapted to face the wall surface. The at least one first engaging element is adapted to spatially correspond to at least one second engaging element of the inverter. The at least one first engaging element and the at least one second engaging element are able to engage with each other to mount the inverter on the wall surface.

In accordance with an aspect of the present disclosure, an inverter assembly is provided. The inverter assembly includes an inverter and a mounting assembly. The inverter includes a wire port and at least one second engaging element disposed on a rear side of the inverter. The mounting assembly includes a waterproof component and a fixing component. The waterproof component is configured to be mounted on a wall surface. The waterproof component includes a first side, a second side, at least one opening and at least gasket set. The first side and the second side are opposite to each other, the first side is adapted to face the inverter, and the second side is adapted to face the wall surface. The at least one opening runs through the first side and the second side and is adapted to spatially correspond to a wire outlet on the wall surface and the wire port of the inverter. The at least one gasket set is disposed around the periphery of the at least one opening. When the inverter is mounted on the wall surface, the at least one opening is aligned to the wire port, the at least one gasket set abuts against the wall surface and the inverter, respectively, and the inverter is in electrical connection with a wire running through the wire outlet, the at least one opening and the wire port of the inverter. The fixing component is configured to be disposed on the wall surface and connected to the waterproof component. The fixing component includes a third side, a fourth side and at least one first engaging element. The third side and the fourth side are opposite to each other, the third side is adapted to face the inverter, and the fourth side is adapted to face the wall surface. The at least one first engaging element is adapted to spatially correspond to the at least one second engaging element of the inverter. The at least one first engaging element and the at least one second engaging element are able to engage with each other to mount the inverter on the wall surface.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
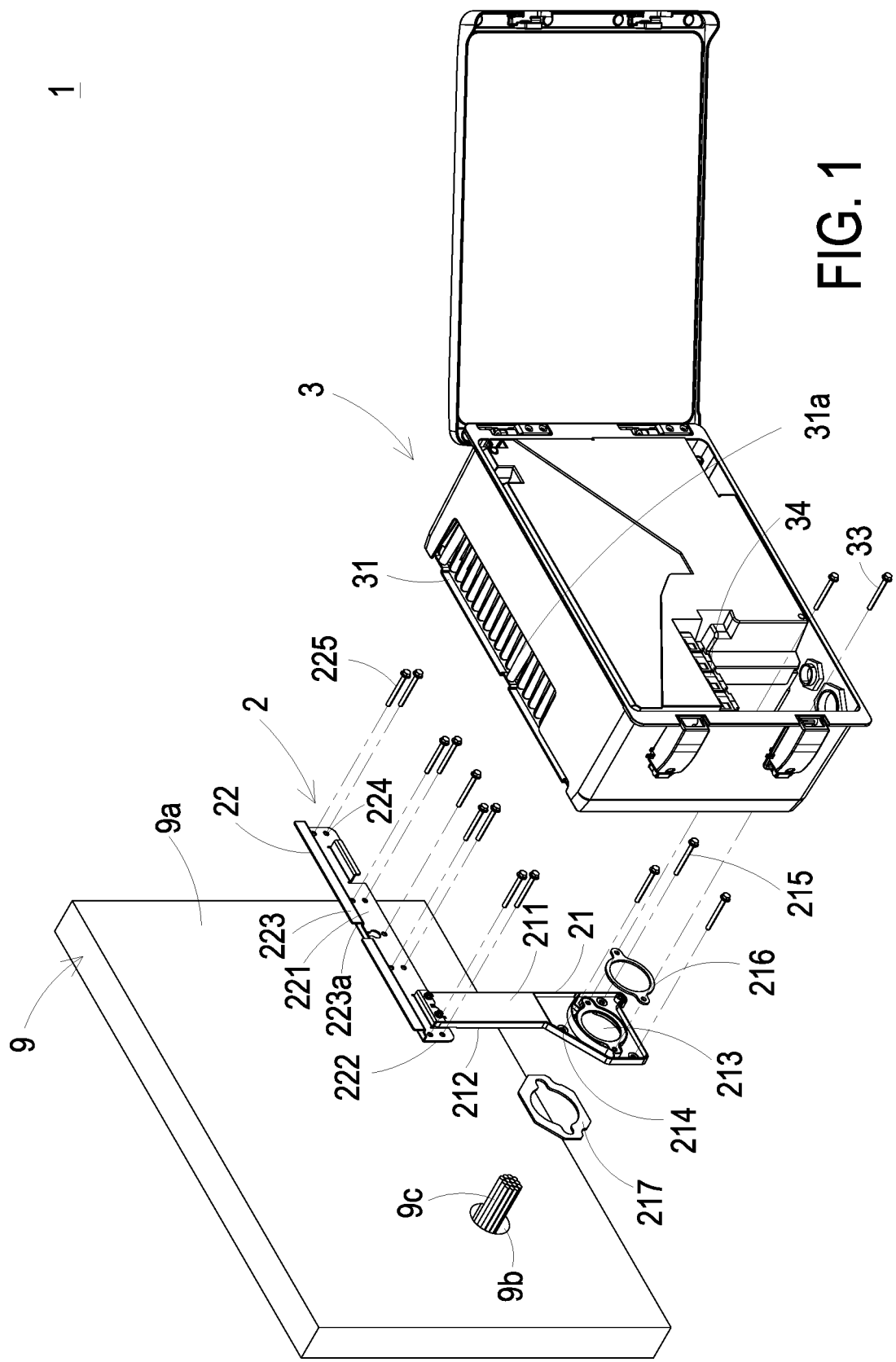
FIG. 1 is an exploded view illustrating an inverter assembly according to a preferred embodiment of the present disclosure.
Figure 2:
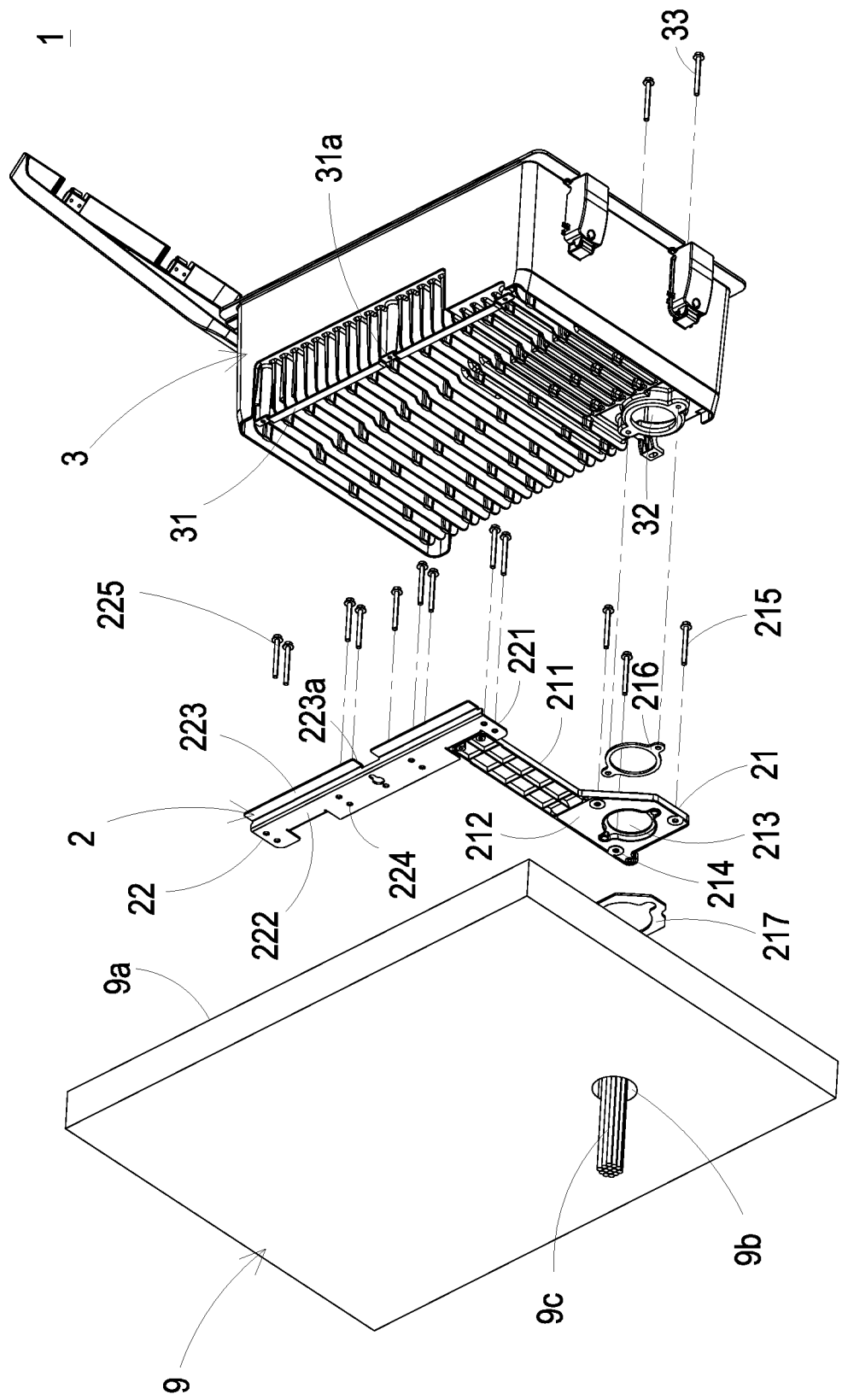
FIG. 2 is an exploded view illustrating the inverter assembly according to the preferred embodiment of the present disclosure and taken at a different observation angle.
Figure 3:
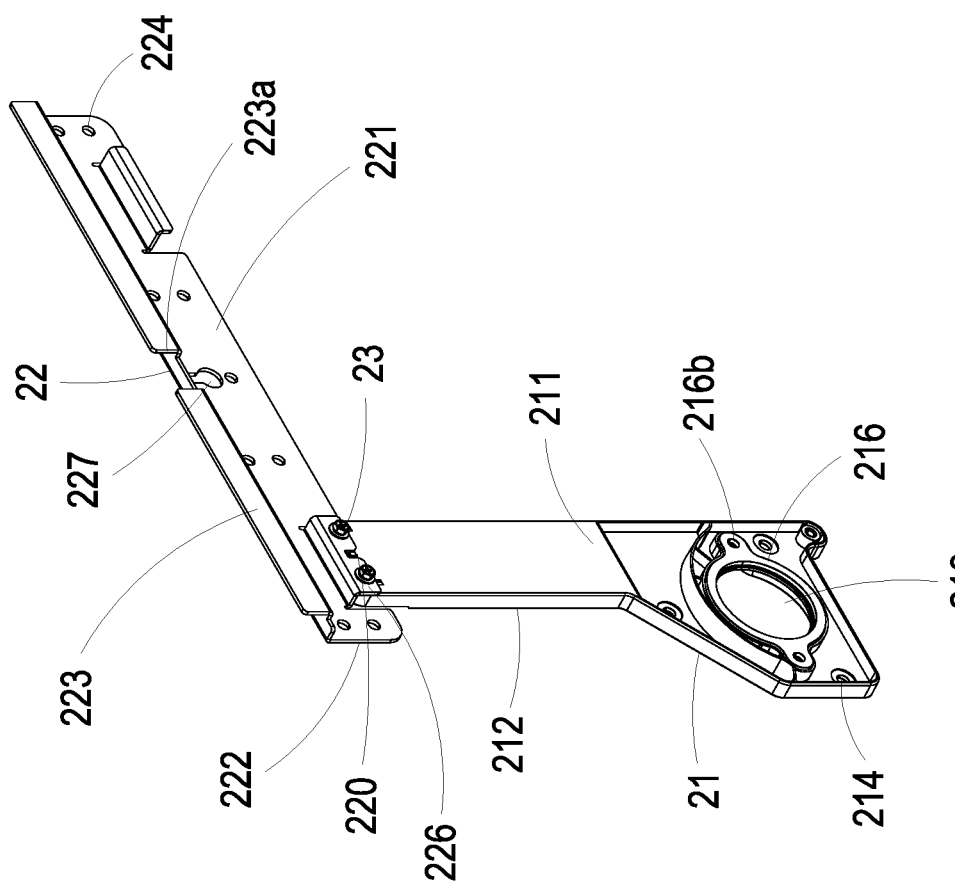
FIG. 3 is a perspective structural view illustrating the mounting assembly according to the preferred embodiment of the present disclosure.
Figure 4:
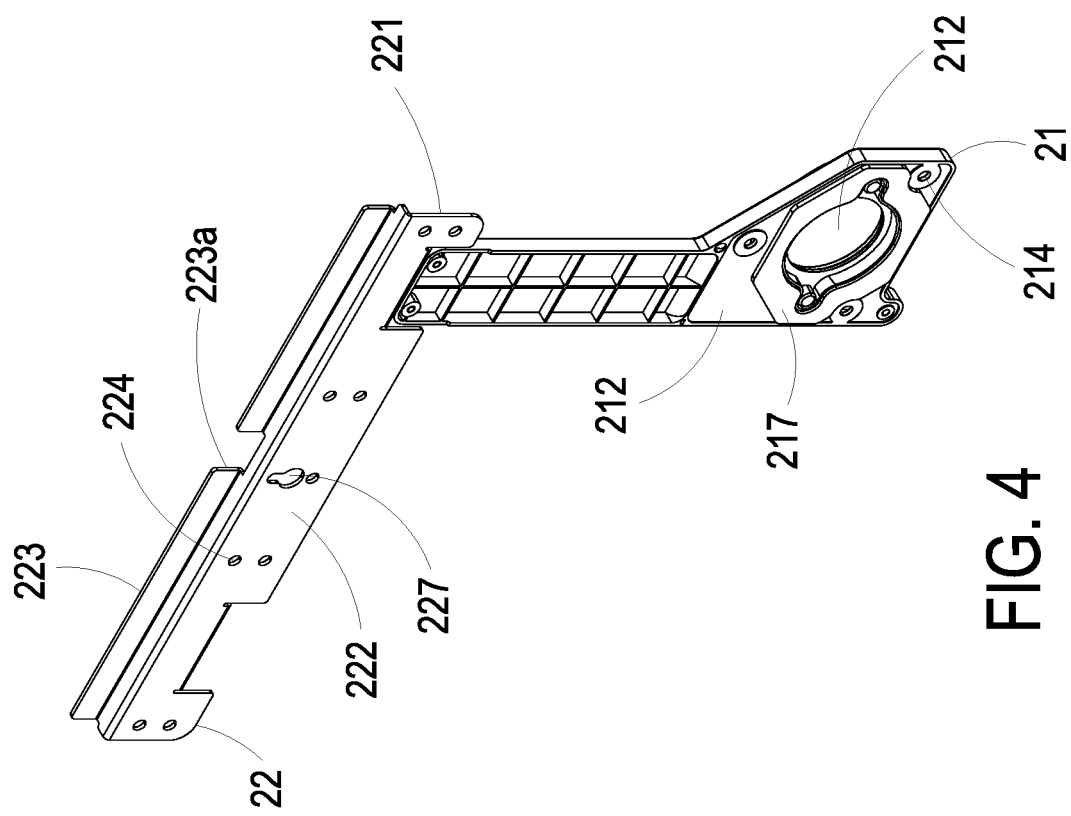
FIG. 4 is a perspective structural view illustrating the mounting assembly according to the preferred embodiment of the present disclosure and taken at a different observation angle.
Figure 5:
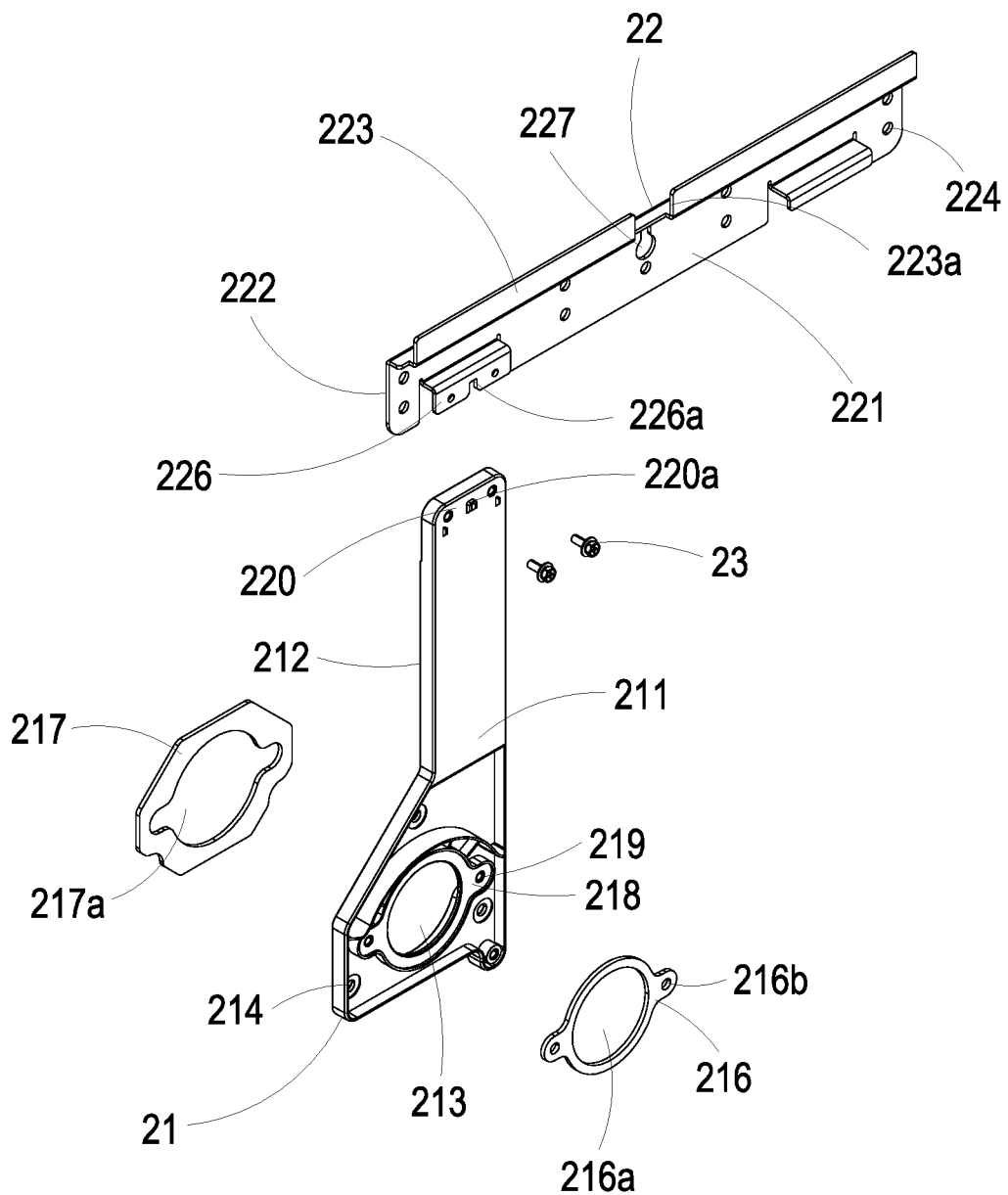
FIG. 5 is an exploded view illustrating the mounting assembly according to the preferred embodiment of the present disclosure.
Figure 6:
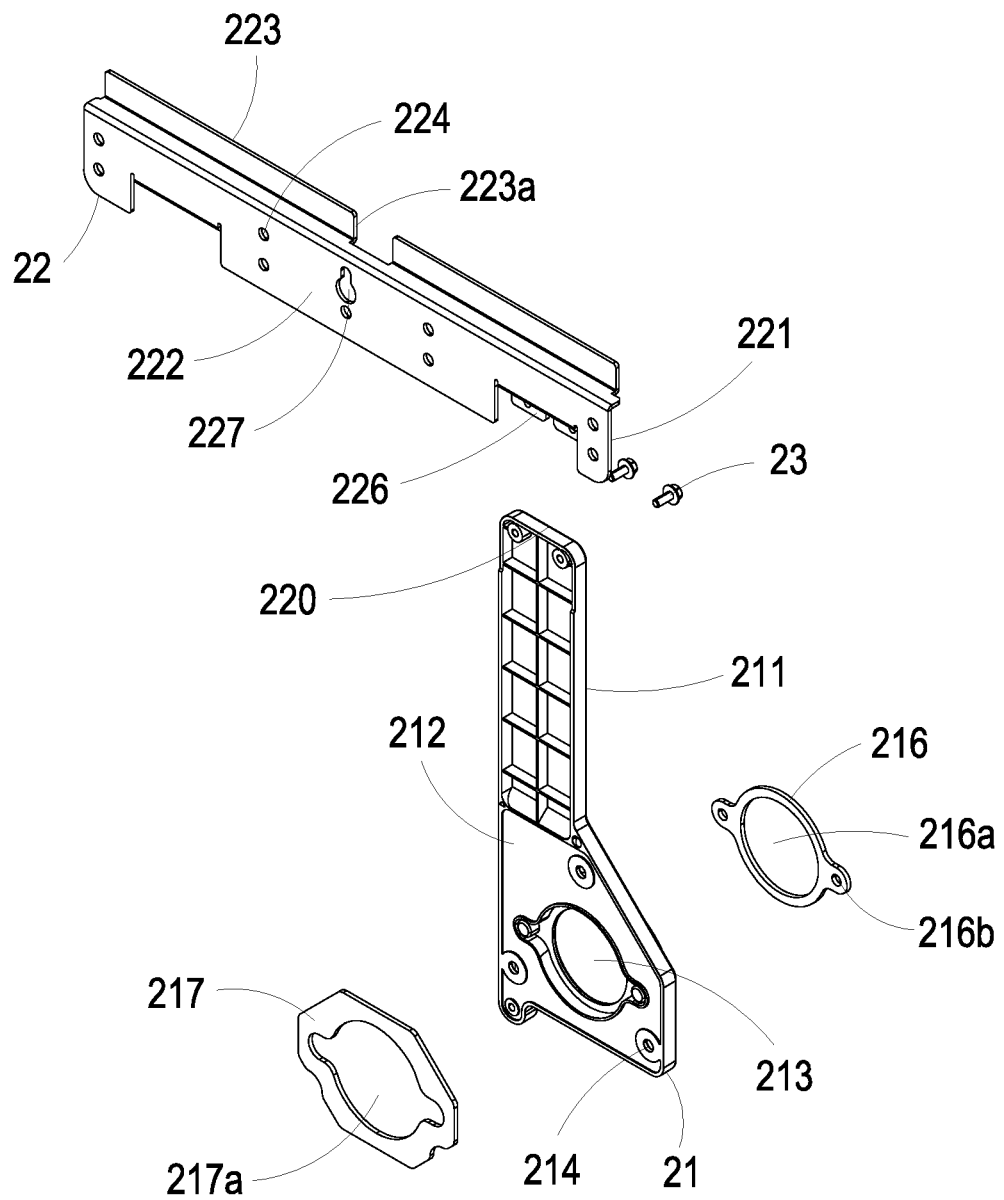
FIG. 6 is an exploded view illustrating the mounting assembly according to the preferred embodiment of the present disclosure and taken at a different observation angle.

FIG. 1 is an exploded view illustrating an inverter assembly according to a preferred embodiment of the present disclosure. FIG. 2 is an exploded view illustrating the inverter assembly according to the preferred embodiment of the present disclosure and taken at a different observation angle. FIG. 3 is a perspective structural view illustrating the mounting assembly according to the preferred embodiment of the present disclosure. FIG. 4 is a perspective structural view illustrating the mounting assembly according to the preferred embodiment of the present disclosure and taken at a different observation angle. FIG. 5 is an exploded view illustrating the mounting assembly according to the preferred embodiment of the present disclosure. FIG. 6 is an exploded view illustrating the mounting assembly according to the preferred embodiment of the present disclosure and taken at a different observation angle. In the embodiment, the inverter assembly 1 includes a mounting assembly 2 and an inverter 3. The mounting assembly 2 includes a waterproof component 21 and a fixing component 22. The inverter 3 includes a wire port 32. Preferably but not exclusively, the wire port 32 is disposed on a rear side of the inverter 3. In the embodiment, the waterproof component 21 is configured to be mounted on a wall surface 9a of a wall 9. Preferably but not exclusively, the wall surface 9a is a vertical wall surface. Moreover, the wall 9 includes a wire outlet 9b disposed on the wall surface 9a and configured to allow a wire to run through and lead out. In the embodiment, the waterproof component 21 includes a first side 211, a second side 212, at least one opening 213 and at least one gasket set 216, 217. The first side 211 and the second side 212 are opposite to each other. The first side 211 is adapted to face the inverter 3. The second side 212 is adapted to face the wall surface 9a. The at least one opening 213 runs through the first side 211 and the second side 212. The at least one opening 213 is adapted to spatially correspond to the wire outlet 9b on the wall surface 9a and the wire port 32 of the inverter 3. The at least one gasket set 216, 217 is disposed around the periphery of the at least one opening 213. When the inverter 3 is mounted on the wall surface 9a through the mounting assembly 2, the at least one gasket set 216, 217 abuts against the wall surface 9a and the inverter 3, respectively. Thus, a wire 9c runs through the wire outlet 9b, the at least one opening 213 and the wire port 32 and is in electrical connection with an electronic component 34 of the inverter 3. In the embodiment, the fixing component 22 is configured to be disposed on the wall surface 9a and connected to the waterproof component 21. The fixing component 22 includes a third side 221, a fourth side 222 and at least one first engaging element 223. The third side 221 and the fourth side 222 are opposite to each other. The third side 221 is adapted to face the inverter 3 and the fourth side 222 is adapted to face the wall surface 9a. In the embodiment, the inverter 3 further includes at least one second engaging element 31. The at least one first engaging element 223 of the fixing component 22 is adapted to spatially correspond to at least one second engaging element 31 of the inverter 3. The at least one first engaging element 223 and the at least one second engaging element 31 are able to engage with each other, so that the inverter 3 is mounted on the wall surface 9a through the mounting assembly 2.

In the embodiment, the at least one gasket set 216, 217 includes a first gasket 216 and a second gasket 217, which are disposed on the first side 211 and the second side 212, respectively. The waterproof component 21 includes at least one first fastening set 214, 215, which is disposed around the periphery of the second gasket 217 and configured to fix the waterproof component 21 on the wall surface 9a. Thus, the second gasket 217 is tightly fitted between the waterproof component 21 and the wall surface 9a. Preferably but not exclusively, the first fastening set 214, 215 includes a first fastening hole 214 and a first fastening element 215. The first fastening hole 214 is disposed on the waterproof component 21. The first fastening element 215 is able to run through the first fastening hole 214 to fix the waterproof component 21 on the wall surface 9a. In addition, the fixing component 22 includes at least one second fastening set 224, 225 configured to fix the fixing component 22 on the wall surface 9a. Preferably but not exclusively, the second fastening set 224, 225 includes a second fastening hole 224 and a second fastening element 225. The second fastening hole 224 is disposed on the fixing component 22. The second fastening element 225 is able to run through the second fastening hole 224 to fix the fixing component 22 on the wall surface 9a. In the embodiment, when the second fastening element 225 fixes the fixing component 22 on the wall surface 9a through the second fastening hole 224, and the at least one first engaging element 223 of the fixing component 22 is engaged with the at least one second engaging element 31 of the inverter 3, the wire port 32 of the inverter 3 is aligned to the at least one opening 213 of the waterproof component 21.

Notably, in order to align the wire port 32 of the inverter 3 with the at least one opening 213 of the waterproof component 21, as the second fastening element 225 fixes the fixing component 22 on the wall surface 9a through the second fastening hole 224 and the at least one first engaging element 223 of the fixing component 22 is engaged with the second engaging element 31 of the inverter 3, the first engaging element 223 of the fixing component 22 further includes a first positioning portion 223a and the second engaging element 31 of the inverter 3 further includes a second positioning portion 31a. Preferably but not exclusively, the first positioning portion 223a and the second positioning portion 31a are a recess and a protrusion, respectively. The first positioning portion 223a and the second positioning portion 31a are able to match with each other. When the first engaging element 223 and the second engaging element 31 are engaged with each other, it facilitates the at least one opening 213 of the waterproof component 21 to align to the wire port 32 of the inverter 3. Moreover, in the embodiment, the waterproof component 21 includes a first connection end 220, which is extended outwardly from the at least one opening 213. The fixing component 22 includes a second connection end 226 located for example at an end of the fixing component 22. The first connection end 220 and the second connection end 226 are engaged with each other, so as to connect the waterproof component 21 with the fixing component 22 and form the mounting assembly 2. In the embodiment, the mounting assembly 2 further includes a connection element 23, for example but not limited to a screw, which is engaged with the screw holes on the first connection end 220 and the second connection end 226, so as to connect the waterproof component 21 with the fixing component 22 and form the mounting assembly 2.

Moreover, in the embodiment, the first connection end 220 includes a third positioning portion 220a and the second connection end 226 includes a fourth positioning portion 226a. The third positioning portion 220a and the fourth positioning portion 226a are able to match with each other. As the waterproof component 21 and the fixing component 22 are connected with each other, the second fastening element 225 fixes the fixing component 22 on the wall surface 9a through the second fastening hole 224 and the at least one first engaging element 223 of the fixing component 22 is engaged with the second engaging element 31 of the inverter 3. Consequently, the wire port 32 of the inverter 3 is aligned to the at least one opening 213 of the waterproof component 21. Certainly, the connection method of the waterproof component 21 and the fixing component 22 is not limited to that of the above embodiment. In an embodiment, the waterproof component 21 and the fixing component 22 are integrally formed into one piece of the mounting assembly 2 by for example but not limited to the mechanical stamping. The connection method of the waterproof component 21 and the fixing component 22 is adjustable according to the practical requirements, and not redundantly described herein.

On the other hand, in the embodiment, the first gasket 216 and the second gasket 217 are disposed on the first side 211 and the second side 212. Preferably but not exclusively, the first gasket 216 includes a first gasket opening 216a, which is adapted to spatially correspond to the at least one opening 213 and the wire port 32 of the inverter 3. Preferably but not exclusively, the second gasket 217 includes a second gasket opening 217a, which is adapted to spatially correspond to the at least one opening 213 and the wire outlet 9b on the wall surface 9a. In the embodiment, the waterproof component 21 further includes a receiving slot 218, which is disposed around the periphery of the at least one opening 213. The first gasket 216 is partially received in the receiving slot 218. In the embodiment, the waterproof component 21 includes at least one engaging hole 219, which is disposed adjacent to the periphery of the at least one opening 213, and further disposed on a bottom surface of the receiving slot 218. The first gasket 216 includes at least one through hole 216b, which is disposed adjacent to the periphery of the first gasket opening 216a and adapted to spatially correspond to the at least one engaging hole 219. The inverter 3 includes at least one third fastening set 33, for example but not limited to a screw and a screw hole, which is disposed around the periphery of the wire port 32 and adapted to spatially correspond to the at least one through hole 216b and the at least one engaging hole 219. The third fastening set 33 runs through the through hole 216b and engages with the engaging hole 219, so as to mount the inverter 3 on the waterproof component 21, and the first gasket 216 is tightly fitted between the waterproof component 21 and the inverter 3. Furthermore, as described above, when the first fastening element 215 runs through the first fastening hole 214 to fix the waterproof component 21 on the wall surface 9a, the second gasket 217 is tightly fitted between the waterproof component 21 and the wall surface 9a. Thus, the mounting assembly 2 allows the wire port 32 of the inverter 3 to be directly aligned with the wire outlet 9b on the wall surface 9a. In that, a wire 9c runs through the wire outlet 9b, the at least one opening 213 and the wire port 32 and is in electrical connection with the electronic component 34 of the inverter 3. Since the wire 9c connected to the inverter 3 is kept from being exposed and the electrical connection between the wire 9c and the inverter 3 is achieved at the shortest distance, the waterproofness of the inverter 3 is effectively improved and the safety of the inverter assembly 1 is ensured for use.

Notably, in other embodiments, the first gasket 216 and the second gasket 217 are connected with each other and integrally formed into a one-piece gasket set. The combination method of the first gasket 216 and the second gasket 217 is not an essential feature to limit the present disclosure. In the embodiment, the area of the first gasket opening 216a is less than or equal to the area of the second gasket opening 217a. It facilitates the wire 9c to be electrically connected to the electronic device 34 of the inverter 3 by passing through the second gasket opening 217a, the opening 213, the first gasket opening 216a and the wire port 32 sequentially from the outlet port 9b. With the first gasket 216 tightly fitted between the waterproof component 21 and the inverter 3, and the second gasket 217 tightly fitted between the waterproof component 21 and the wall surface 9a, the wire 9c electrically connected to the inverter 3 is kept from being exposed. Thus, the inverter assembly 1 can provide sufficient protection for the wire 9c and achieve the waterproof effect.

Figure 7A:
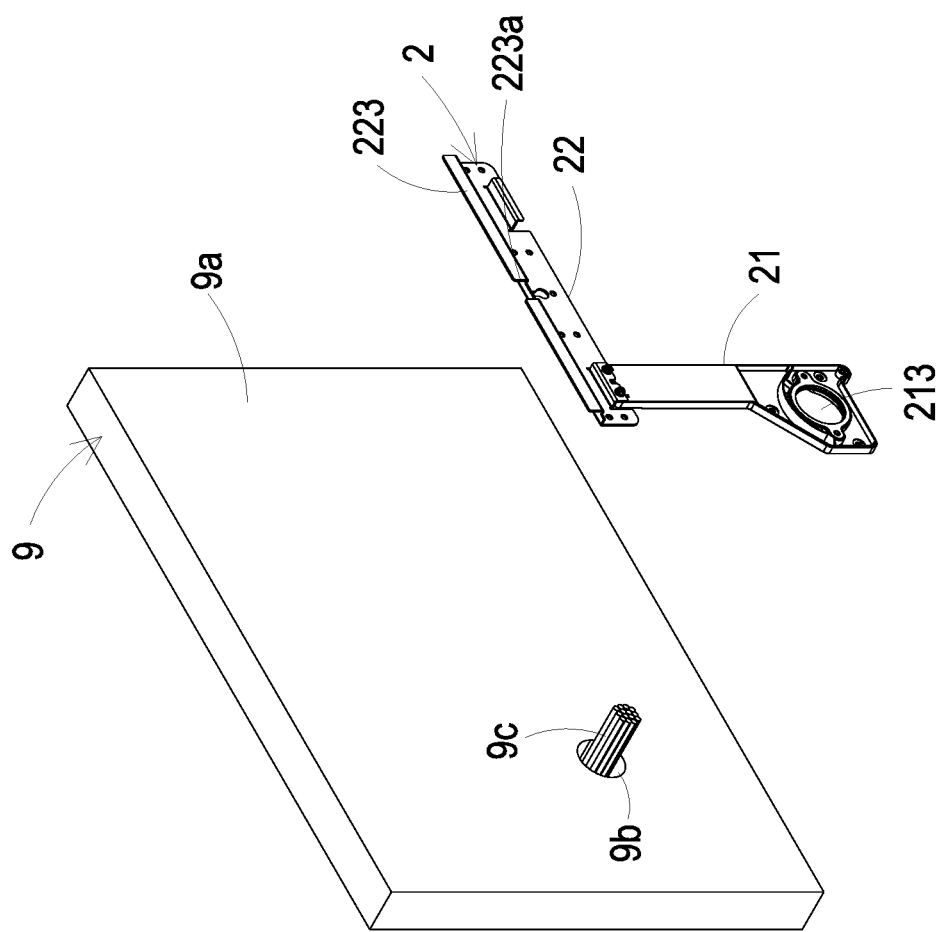
FIGS. 7A to 7D show the inverter assembly at different stages of installation according to the preferred embodiment of the present disclosure.
Figure 7B:
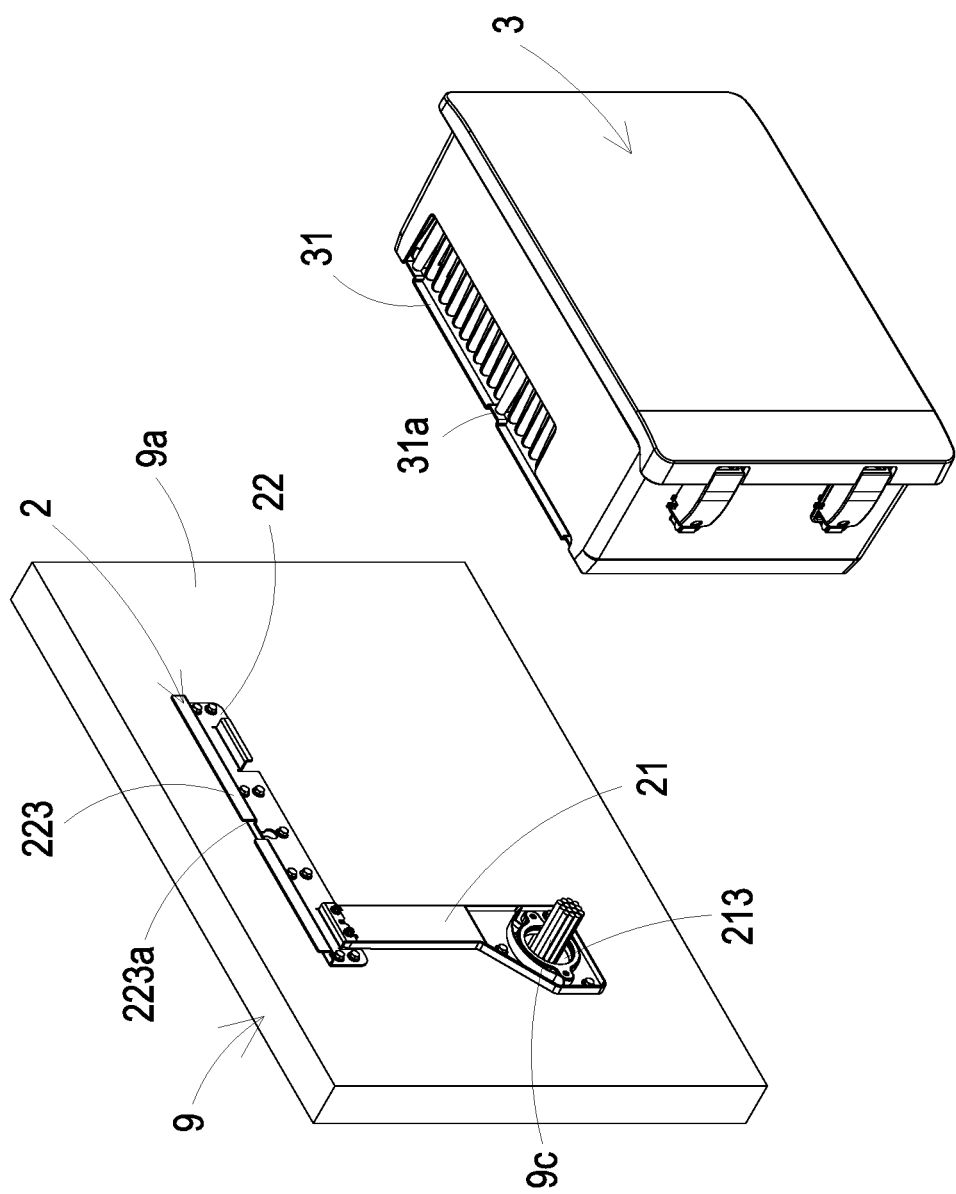
Figure 7C:
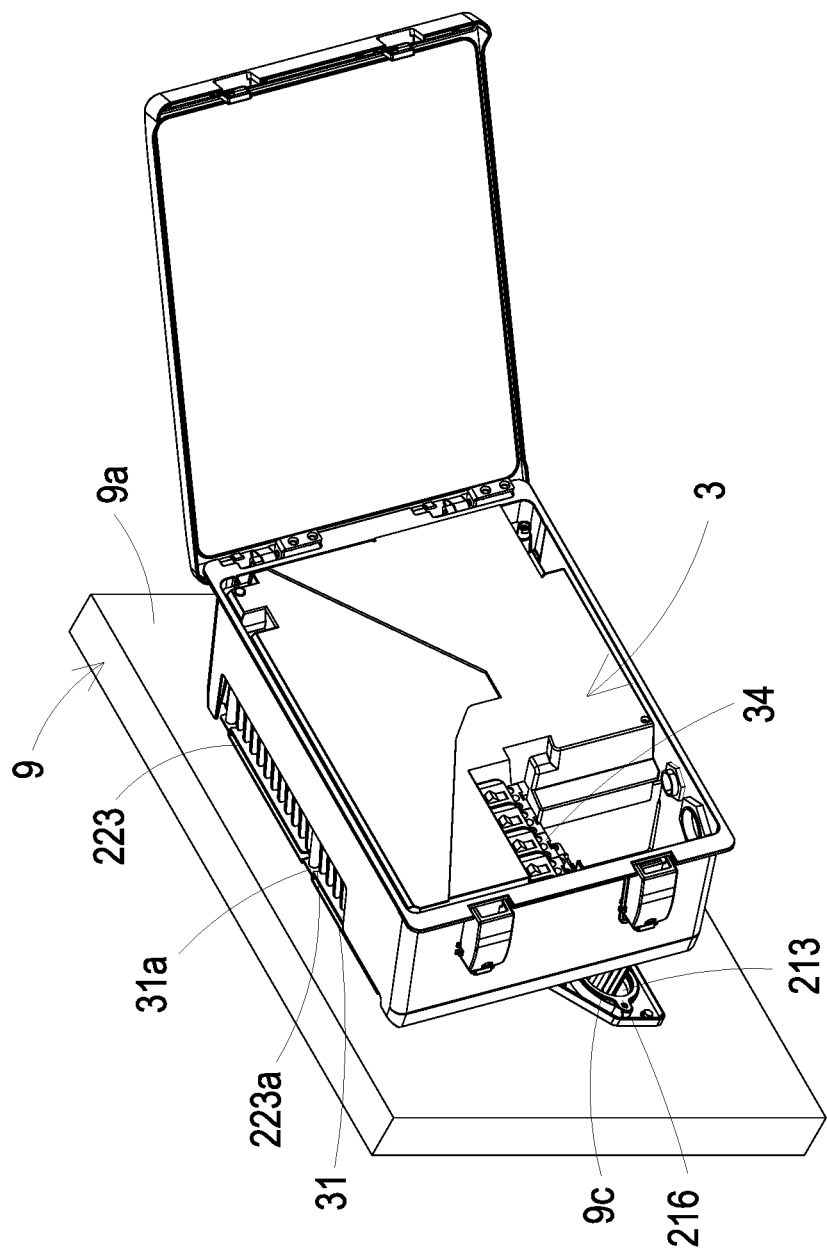
Figure 7D:
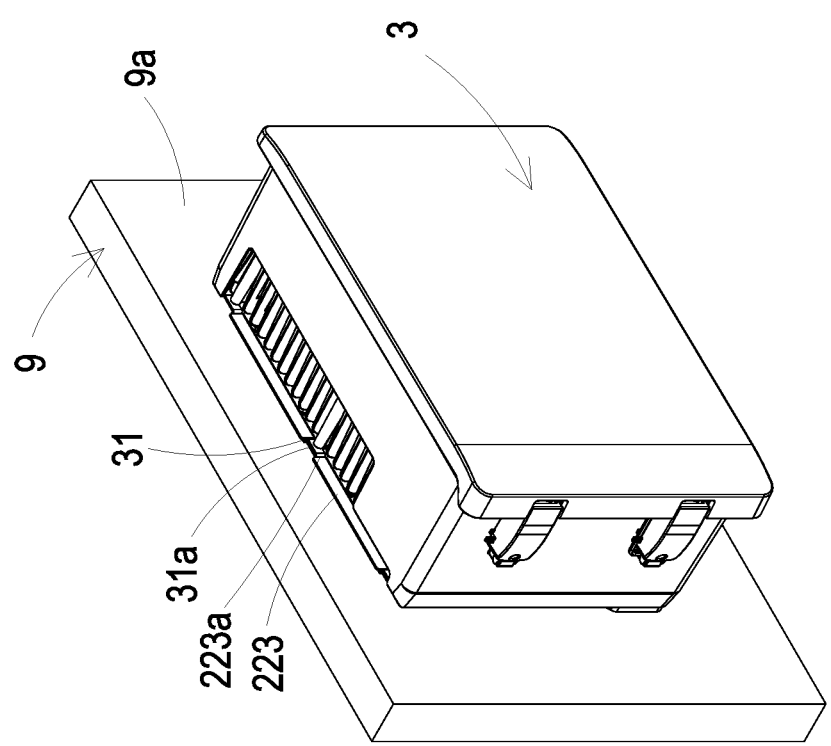

Please refer to FIGS. 1 to 6 and FIGS. 7A to 7D. FIGS. 7A to 7D show the inverter assembly at different stages of installation according to the preferred embodiment of the present disclosure. In the embodiment, when the first engaging element 223 of the mounting assembly 2 is engaged with the second engaging element 31 of the inverter 3, the wire port 32 of the inverter 3 is directly aligned with the opening 213 of the mounting assembly 2 and the wire outlet 9b on the wall surface 9a, so that the installation process is effectively simplified. Firstly, as shown in FIG. 7A, the waterproof component 21 and the fixing component 22 of the mounting assembly 2 are combined into one piece and mounted on the wall surface 9a. In the embodiment, the waterproof component 21 is mounted on the wall surface 9a by the first fastening element 215 running through the first fastening hole 214, and the fixing component 22 is mounted on the wall surface 9a by the second fastening element 225 running through the second fastening hole 224. In the embodiment, the fixing component 22 further includes a fixing aperture 227 running through the third side 221 and the fourth side 222 and is configured to allow a supporting element (not shown), for example a hook disposed on the wall surface 9a, to run through, so as to hold the fixing component 22. Certainly, any method capable of fixing the mounting assembly 2 on the wall surface 9a is suitable in the present disclosure, but not redundantly described herein. It should be noted that the opening 213 of the waterproof component 21 is aligned with the wire outlet 9b on the wall surface 9a as the mounting assembly 2 is mounted on the wall surface 9a. Preferably but not exclusively, the area of the second gasket opening 217a of the second gasket 217 is greater than or equal to the area of the wire outlet 9b, so as to ensure that the second gasket 217 encloses the periphery of the wire outlet 9b completely, and the second gasket 217 is tightly fitted between the waterproof component 21 and the wall surface 9a. In that, as shown in FIG. 7B, the wire 9c is led to pass through the wire outlet 9b, the second gasket opening 217a, the opening 213 and the first gasket opening 216a (referring to FIG. 1). Thereafter, the first positioning portion 223a of the first engaging element 223 of the mounting assembly 2 and the second positioning portion 31a of the inverter 3 are able to match with each other, to make the at least one first engaging element 223 be engaged with the second engaging element 31 of the inverter 3, as shown in FIG. 7C. In that, the inverter 3 can be tilted, for example at an angle to facilitate the user leading the wire 9c to pass through the wire port 32 of the inverter 3. When the user leads the wire 9c to pass through the wire port 32 (referring to FIG. 2) disposed on the rear side of the inverter 3, and make the inverter 3 attach to the wall surface 9a, the at least one opening 213 of the mounting assembly 2 is aligned to the wire port 32 of the inverter 3. With the engagement between the first engaging element 223 and the second engaging element 31 and the weight load of the inverter 3, the first gasket 216 is tightly fitted between the waterproof component 21 of the mounting assembly 2 and the inverter 3. In the embodiment, the third fastening set 33 of the inverter 3 (referring to FIGS. 1 and 2) is engaged with the engaging hole 219 through the through hole 216b. Consequently, the inverter 3 is further fixed on the waterproof component 21 of the mounting assembly 2, to ensure that the first gasket 216 is tightly fitted between the waterproof component 21 and the inverter 3. Finally, the user connects the wire 9c to the electronic component 34 of the inverter 3 and closes the front cover of the inverter 3. Thus, the electrical connection of the inverter assembly 1 with the wire 9c is achieved at the shortest distance. The waterproof effect is achieved and the safety of the inverter assembly 1 is ensured for use at the same time. Notably, by utilizing the first engaging element 223 of the mounting assembly 2 and the second engaging element 31 of the inverter 3, the wire port 32 of the inverter 3 is aligned to the opening 213 of the mounting assembly 2 and the wire outlet 9b on the wall surface 9a. It simplifies the installation process. Certainly, the engaging method between the first engaging element 223 of the mounting assembly 2 and the second engaging element 31 of the inverter 3 is not an essential feature to limit the present disclosure. Any method by utilizing two engaging elements to achieve the purpose of mounting are suitable in the present disclosure, but not redundantly described herein.

In summary, the present disclosure provides a waterproof-designed mounting assembly and an inverter assembly using the same. By utilizing the waterproof-designed mounting assembly, the inverter can be directly mounted on, for example, a vertical wall, and electrically connected to the wires led out from the wall at the shortest distance. At the same time, the waterproof function is achieved. The structure of the mounting assembly is compact, and the conductive wires are kept from being exposed. Thus, the installation process of the inverter is simplified and the safety of the inverter assembly is ensured for use. The mounting assembly has waterproof and fixed functions combined together. During installation, the mounting assembly allows the wire port of the inverter to be directly aligned with the wire outlet of the wall, so as to simplify the installation process. After installation, the mounting assembly keeps the conductive wires of the inverter from being exposed, and the inverter is electrically connected to the wires led out from the wire outlet on the wall surface at the shortest distance. Thus, the waterproofness of the inverter is effectively improved and the safety of the inverter assembly is ensured for use.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A mounting assembly for an inverter, comprising:
 a waterproof component configured to be mounted on a wall surface, wherein the waterproof component comprises:
  a first side;
  a second side, wherein the first side and the second side are opposite to each other, the first side is adapted to face the inverter, and the second side is adapted to face the wall surface;
  at least one opening running through the first side and the second side and adapted to spatially correspond to a wire outlet on the wall surface and a wire port of the inverter; and
  at least one gasket set disposed around the periphery of the at least one opening, wherein when the inverter is mounted on the wall surface, the at least one opening is aligned to the wire port, the at least one gasket set abuts against the wall surface and the inverter, respectively, and the inverter is in electrical connection with a wire running through the wire outlet, the at least one opening and the wire port; and
 a fixing component configured to be disposed on the wall surface and connected to the waterproof component, wherein the fixing component comprises:
  a third side;
  a fourth side, wherein the third side and the fourth side are opposite to each other, the third side is adapted to face the inverter, and the fourth side is adapted to face the wall surface; and
  at least one first engaging element adapted to spatially correspond to at least one second engaging element of the inverter, wherein the at least one first engaging element and the at least one second engaging element are able to engage with each other to mount the inverter on the wall surface.

2. The mounting assembly according to claim 1, wherein the waterproof component comprises at least one first fastening set disposed around the periphery of the at least one gasket set and configured to fix the waterproof component on the wall surface, and the gasket set is able to be tightly fitted between the waterproof component and the wall surface.

3. The mounting assembly according to claim 2, wherein the first fastening set comprises a first fastening hole and a first fastening element, the first fastening hole is disposed on the waterproof component, the first fastening element is able to run through the first fastening hole to fix the waterproof component on the wall surface, and the at least one gasket set is able to be tightly fitted between the waterproof component and the wall surface.

4. The mounting assembly according to claim 1, wherein the fixing component comprises at least one second fastening set configured to fix the fixing component on the wall surface, wherein when the at least one first engaging element and the at least one second engaging element are engaged with each other, the wire port of the inverter is aligned to the at least one opening of the waterproof component.

5. The mounting assembly according to claim 4, wherein the second fastening set comprises a second fastening hole and a second fastening element, the second fastening hole is disposed on the fixing component, and the second fastening element is able to run through the second fastening hole to fix the fixing component on the wall surface.

6. The mounting assembly according to claim 1, wherein the at least one gasket set comprises a first gasket and a second gasket disposed on the first side and the second side, respectively, wherein the first gasket comprises a first gasket opening adapted to spatially correspond to the at least one opening and the wire port, wherein the second gasket comprises a second gasket opening adapted to spatially correspond to the at least one opening and the wire outlet.

7. The mounting assembly according to claim 6, wherein the waterproof component comprises a receiving slot disposed around the periphery of the opening, and the first gasket is partially received in the receiving slot.

8. The mounting assembly according to claim 7, wherein the waterproof component comprises at least one engaging hole disposed adjacent to the periphery of the at least one opening, the first gasket comprises at least one through hole disposed adjacent to the periphery of the first gasket opening and adapted to spatially correspond to the at least one engaging hole, wherein the inverter comprises at least one third fastening set disposed adjacent the periphery of the wire port and adapted to spatially correspond to the at least one engaging hole and the at least one through hole, wherein the third fastening set runs through the through hole and engages with the engaging hole to mount the inverter on the waterproof component, and the first gasket is tightly fitted between the waterproof component and the inverter.

9. The mounting assembly according to claim 8, wherein the at least one engaging hole is disposed on a bottom surface of the receiving slot.

10. The mounting assembly according to claim 6, wherein the first gasket and the second gasket are connected with each other and integrally formed into one piece.

11. The mounting assembly according to claim 6, wherein the area of the first gasket opening is less than or equal to the area of the second gasket opening.

12. The mounting assembly according to claim 1, wherein the first engaging element comprises a first positioning portion and the second engaging element comprises a second positioning portion, wherein the first positioning portion and the second positioning portion are able to match with each other, wherein when the first engaging element and the second engaging element are engaged with each other, the at least one opening of the waterproof component is aligned to the wire port of the inverter.

13. The mounting assembly according to claim 1, wherein the waterproof component comprises a first connection end extended outwardly from the at least one opening, wherein the fixing component comprises a second connection end located at an end of the fixing component, wherein the first connection end and the second connection end are engaged with each other to connect the waterproof component with the fixing component to form the mounting assembly.

14. The mounting assembly according to claim 13, further comprising a connection element engaged with the first connection end and the second connection end to connect the waterproof component with the fixing component to form the mounting assembly.

15. The mounting assembly according to claim 13, wherein the first connection end comprises a third positioning portion and the second connection end comprises a fourth positioning portion, wherein the third positioning portion and the fourth positioning portion are able to match with each other.

16. The mounting assembly according to claim 1, wherein the fixing component comprises a fixing aperture running through the third side and the fourth side and configured to allow a supporting element disposed on the wall surface to run through.

17. An inverter assembly comprising:
an inverter comprising a wire port and at least one second engaging element disposed on a rear side of the inverter; and
a mounting assembly comprising:
a waterproof component configured to be mounted on a wall surface, wherein the waterproof component comprises:
a first side;
a second side, wherein the first side and the second side are opposite to each other, the first side is adapted to face the inverter, and the second side is adapted to face the wall surface;
at least one opening running through the first side and the second side and adapted to spatially correspond to a wire outlet on the wall surface and the wire port of the inverter; and
at least one gasket set disposed around the periphery of the at least one opening, wherein when the inverter is mounted on the wall surface, the at least one opening is aligned to the wire port, the at least one gasket set abuts against the wall surface and the inverter, respectively, and the inverter is in electrical connection with a wire running through the wire outlet, the at least one opening and the wire port; and
a fixing component configured to be disposed on the wall surface and connected to the waterproof component, wherein the fixing component comprises:
a third side;
a fourth side, wherein the third side and the fourth side are opposite to each other, the third side is adapted to face the inverter, and the fourth side is adapted to face the wall surface; and
at least one first engaging element adapted to spatially correspond to the at least one second engaging element of the inverter, wherein the at least one first engaging element and the at least one second engaging element are able to engage with each other to mount the inverter on the wall surface.

* * * * *